United States Patent
Shatalov et al.

(10) Patent No.: US 9,997,667 B2
(45) Date of Patent: Jun. 12, 2018

(54) SEMICONDUCTOR MATERIAL DOPING

(71) Applicant: Sensor Electronic Technology, Inc., Columbia, SC (US)

(72) Inventors: Maxim S. Shatalov, Columbia, SC (US); Remigijus Gaska, Columbia, SC (US); Jinwei Yang, Columbia, SC (US); Michael Shur, Latham, NY (US); Alexander Dobrinsky, Loudonville, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days. days.

(21) Appl. No.: 15/495,169

(22) Filed: Apr. 24, 2017

(65) Prior Publication Data
US 2017/0229610 A1 Aug. 10, 2017

Related U.S. Application Data

(63) Continuation of application No. 15/069,272, filed on Mar. 14, 2016, now Pat. No. 9,634,183, which is a (Continued)

(51) Int. Cl.
*H01L 33/06* (2010.01)
*H01L 33/32* (2010.01)
(Continued)

(52) U.S. Cl.
CPC .......... *H01L 33/06* (2013.01); *H01L 33/0075* (2013.01); *H01L 33/145* (2013.01); *H01L 33/325* (2013.01)

(58) Field of Classification Search
CPC ... H01L 33/06; H01L 33/0075; H01L 33/145; H01L 33/325; H01L 29/155
See application file for complete search history.

(56) References Cited

U.S. PATENT DOCUMENTS 4,705,361 A 11/1987 Frazier
5,047,810 A 9/1991 Chemla et al.
(Continued)

FOREIGN PATENT DOCUMENTS

JP 2007250991 A2 9/2007
KR 1020110048240 A 5/2011

OTHER PUBLICATIONS

Goepfert et al, "Experimental and theoretical study of acceptor activation and transport properties in p-type AlxGa1-xN/GaN superlattices," Journal of Applied Physics, American Institute of Physics, Aug. 15, 2000, 9 pages, vol. 88, No. 4, New York, US.
(Continued)

*Primary Examiner* — Nathan W Ha
(74) *Attorney, Agent, or Firm* — Labatt, LLC

(57) ABSTRACT

A solution for designing and/or fabricating a structure including a quantum well and an adjacent barrier is provided. A target band discontinuity between the quantum well and the adjacent barrier is selected to coincide with an activation energy of a dopant for the quantum well and/or barrier. For example, a target valence band discontinuity can be selected such that a dopant energy level of a dopant in the adjacent barrier coincides with a valence energy band edge for the quantum well and/or a ground state energy for free carriers in a valence energy band for the quantum well. Additionally, a target doping level for the quantum well and/or adjacent barrier can be selected to facilitate a real space transfer of holes across the barrier. The quantum well and the adjacent barrier can be formed such that the actual band discontinuity and/or actual doping level(s) correspond to the relevant target(s).

20 Claims, 13 Drawing Sheets

Related U.S. Application Data continuation-in-part of application No. 13/803,753, filed on Mar. 14, 2013, now Pat. No. 9,287,442, and a continuation-in-part of application No. 13/162,908, filed on Jun. 17, 2011, now Pat. No. 9,368,580, said application No. 13/162,908 is a continuation-in-part of application No. 12/960,476, filed on Dec. 4, 2010, now Pat. No. 8,426,225.

(60) Provisional application No. 61/768,833, filed on Feb. 25, 2013, provisional application No. 61/610,658, filed on Mar. 14, 2012, provisional application No. 61/266,523, filed on Dec. 4, 2009.

(51) Int. Cl.
*H01L 33/00* (2010.01)
*H01L 33/14* (2010.01)

(56) References Cited

U.S. PATENT DOCUMENTS

| | | | |
|---|---|---|---|
| 5,521,742 | A | 5/1996 | Ishimura |
| 5,594,750 | A | 1/1997 | Zhang et al. |
| 5,686,734 | A | 11/1997 | Hamakawa et al. |
| 6,069,367 | A | 5/2000 | Tomiya et al. |
| 6,100,542 | A | 8/2000 | Kohara et al. |
| 6,154,475 | A | 11/2000 | Soref et al. |
| 6,242,766 | B1 | 6/2001 | Tateno |
| 6,403,975 | B1 | 6/2002 | Brunner et al. |
| 7,619,238 | B2 | 11/2009 | Gaska et al. |
| 8,426,225 | B2 | 4/2013 | Shatalov et al. |
| 9,287,442 | B2 | 3/2016 | Shatalov et al. |
| 9,634,183 | B2 | 4/2017 | Shatalov et al. |
| 2001/0011731 | A1* | 8/2001 | Kim ................... B82Y 20/00 257/97 |
| 2003/0178633 | A1 | 9/2003 | Flynn et al. |
| 2011/0138341 | A1 | 6/2011 | Shatalov et al. |
| 2011/0253975 | A1 | 10/2011 | Shatalov et al. |
| 2011/0266520 | A1 | 11/2011 | Shur et al. |

OTHER PUBLICATIONS

Hang et al., "AlxGa1-xN/GaN band offsets determined by deep-level emission," Journal of Applied Physics, 15 Aug. 2001, 4 pages, vol. 90, No. 4.

Kozodoy et al., "Enhanced Mg doping efficiency in Al(0.2)Ga(0.8)N/GaN superlattices," Applied Physics Letters, 3 pages, Jun. 14, 1999, vol. 74, No. 24.

Kozodoy et al., "Polarization-enhanced Mg doping of AlGaN/GaN superlattices," Applied Physics Letters, 3 pages, Oct. 18, 1999, vol. 75, No. 16.

Nakano et al., "Electrical Properties of Acceptor Levels in Mg-Doped GaN," Phys. Stat. Sol., 5 pages, 2002, (c) 0, No. 1.

Saxler et al., "Aluminum gallium nitride short-period superlattices doped with magnesium," Applied Physics Letters, 3 pages, Apr. 5, 1999, vol. 74, No. 14.

Schubert et al., "Enhancement of deep acceptor activation in semiconductors by superlattice doping," Applied Physics Letters, 3 pages, Dec. 9, 1996, vol. 69, No. 24.

Shur et al., "Accumulation hole layer in p-GaN/AlGaN heterostructures," Applied Physics Letters, 3 pages, May 22, 2000, vol. 76, No. 21.

Ha, N., U.S. Appl. No. 13/803,753, Notice of Allowance, filed Nov. 10, 2015, 12 pages.

Ha, N., U.S. Appl. No. 13/803,753, Office Action 1, filed Jun. 24, 2015, 23 pages.

Dang, P., U.S. Appl. No. 12/960,476, Notice of Allowance, filed Dec. 28, 2012, 5 pages.

Dang, P., U.S. Appl. No. 12/960,476, Office Action 1, filed Sep. 19, 2012, 13 pages.

Salerno, S., U.S. Appl. No. 13/162,908, Notice of Allowance, filed Feb. 17, 2016, 12 pages.

Salerno, S., U.S. Appl. No. 13/162,908, Final Office Action1, filed Nov. 20, 2014, 10 pages.

Salerno, S., U.S. Appl. No. 13/162,908, Office Action1, filed Jun. 6, 2014, 34 pages.

Moehl, S., International Application No. 10835241, Office Action 3, dated May 12, 2014, 6 pages.

Moehl, S., International Application No. 10835241, Office Action 1, dated Jun. 14, 2013, 4 pages.

Moehl, S., International Application No. 10835241, Summons to Attend, dated Mar. 17, 2015, 5 pages.

Moehl, S., International Application No. 10835241, Supplementary Partial European Search Report, dated Sep. 3, 2013, 9 pages.

Shibayama, M., International Application No. 2012542233, Office Action, dated Nov. 19, 2013, 7 pages.

Gie, E., PCT Application No. PCT/US2013/031263, Search Report and Written Opinion, dated Jul. 23, 2013, 11 pages.

Kim, S., PCT Application No. PCT/US2010/059003, International Search Report and Written Opinion, dated Jul. 29, 2011, 9 pages.

Ha, N., U.S. Appl. No. 15/069,272, Notice of Allowance, filed Dec. 20, 2016, 14 pages.

\* cited by examiner

SEMICONDUCTOR MATERIAL DOPING

REFERENCE TO RELATED APPLICATIONS

The current application is a continuation of U.S. patent application Ser. No. 15/069,272, filed on 14 Mar. 2016, which is a continuation-in-part of U.S. patent application Ser. No. 13/803,753, filed on 14 Mar. 2013, which claims the benefit of U.S. Provisional Application No. 61/610,658, filed on 14 Mar. 2012 and U.S. Provisional Application No. 61/768,833, filed on 25 Feb. 2013, and which is a continuation-in-part of U.S. patent application Ser. No. 13/162,908, filed on 17 Jun. 2011, which is a continuation-in-part of U.S. patent application Ser. No. 12/960,476, filed on 4 Dec. 2010, which claims the benefit of U.S. Provisional Application No. 61/266,523, filed on 4 Dec. 2009, all of which are hereby incorporated by reference.

GOVERNMENT LICENSE RIGHTS

This invention was made with government support under contract no. W911NF-10-2-0023 awarded by the Defense Advanced Research Projects Agency (DARPA). The government has certain rights in the invention.

TECHNICAL FIELD

The disclosure relates generally to semiconductor device fabrication, and more particularly, to the design and fabrication of a structure including a set of quantum wells and a set of barriers.

BACKGROUND ART

Controlling doping during the manufacture of many types of devices fabricated with wide band gap semiconductor materials is difficult. In particular, impurity levels for wide band gap semiconductor materials are deep and the activation of the impurities is inefficient, thereby making the doping more difficult to control. For example, FIG. 1 shows an illustrative fraction of activated impurities (Magnesium (Mg)) at 300 Kelvin (K) as a function of the impurity level in Aluminum Gallium Nitride (AlGaN) as shown in the prior art. As illustrated, for a Mg acceptor level in AlGaN of approximately 0.1 electron Volts (eV) above the ceiling of the valence band, only approximately one percent of the impurities are activated and supplying free holes. As a result, the conductivity of p-type AlGaN is severely limited, which is extremely detrimental to the performance of deep ultraviolet light emitting diodes (LEDs).

Polarization doping in GaN-on-AlGaN heterostructures has been shown to lead to the creation of a hole accumulation layer. For example, the polarization charge has been shown to induce a hole sheet density as high as $5 \times 10^{13}$ cm$^{-2}$ at an AlGaN/GaN heterointerface. The transition from a three-dimensional to a two-dimensional hole gas is achieved for hole sheet densities on the order of $10^{13}$ cm$^{-2}$ or higher. At lower hole sheet densities, only a three-dimensional hole accumulation layer may exist. This suggests that a two-dimensional hole gas induced by the polarization charge can be used to reduce the base spreading resistance in AlGaN/GaN-based heterostructure bipolar transistors and/or for p-channel group III nitride-based high electron mobility transistors (HEMTs).

FIG. 2 shows an illustrative band diagram of a metal/AlGaN/GaN heterostructure as shown in the prior art. In this case, the top GaN surface of the heterostructure comprises a nitrogen-terminated surface. In FIG. 2, the calculated two-dimensional charge density distribution includes piezoelectric and spontaneous polarization charges, a metal surface charge, and an accumulation hole charge for the heterostructure. The AlGaN layer comprises an Al molar fraction of approximately 0.25, and does not include donors. The GaN layer comprises an acceptor concentration, $N_a = 10^{17}$ cm$^{-3}$. The horizontal dashed line of FIG. 2 shows the Fermi level, and the holes occupy the energy states above this level. The two-dimensional hole gas provides a large lateral conductivity. However, as illustrated by FIG. 2, the conductance in a direction perpendicular to the two-dimensional hole gas is extremely small. The perpendicular conductance for the heterostructure is limited by the undoped or depleted wide band gap semiconductor layer, e.g., the AlGaN layer.

SUMMARY

Aspects of the invention provide a solution for designing and/or fabricating a structure including a quantum well and an adjacent barrier. A target band discontinuity between the quantum well and the adjacent barrier is selected to coincide with an activation energy of a dopant for the quantum well and/or barrier. For example, a target valence band discontinuity can be selected such that a dopant energy level of a dopant in the adjacent barrier coincides with a valence energy band edge for the quantum well and/or a ground state energy for free carriers in a valence energy band for the quantum well. Additionally, a target doping level for the quantum well and/or adjacent barrier can be selected to facilitate a real space transfer of holes across the barrier. The quantum well and the adjacent barrier can be formed such that the actual band discontinuity and/or actual doping level(s) correspond to the relevant target(s).

A first aspect of the invention provides a method of fabricating a structure, the method comprising: selecting a target valence band discontinuity between a quantum well and an adjacent barrier in the structure, wherein a dopant energy level of a dopant in the adjacent barrier coincides with at least one of: a valence energy band edge for the quantum well or a ground state energy for free carriers in a valence energy band for the quantum well; and forming the quantum well and the adjacent barrier in the structure having an actual valence band discontinuity corresponding to the target valence band discontinuity, wherein the forming includes doping the quantum well and the adjacent barrier with the dopant.

A second aspect of the invention provides a method of fabricating a device, the method comprising: fabricating a structure for the device, the structure including at least one of: a heterostructure or a superlattice layer comprising a quantum well and an adjacent barrier, the fabricating the structure including: selecting a target valence band discontinuity between the quantum well and the adjacent barrier, wherein a dopant energy level of a dopant in the adjacent barrier coincides with at least one of: a valence energy band edge for the quantum well or a ground state energy for free carriers in a valence energy band for the quantum well; and forming the quantum well and the adjacent barrier in the structure having an actual valence band discontinuity corresponding to the target valence band discontinuity, wherein the forming includes doping the quantum well and the adjacent barrier with the dopant.

A third aspect of the invention provides a method comprising: designing at least one of: a heterostructure or a superlattice layer for a device comprising a quantum well and an adjacent barrier, the designing including: selecting a target valence band discontinuity between the quantum well and the adjacent barrier, wherein a dopant energy level of a dopant in the adjacent barrier coincides with at least one of: a valence energy band edge for the quantum well or a ground state energy for free carriers in a valence energy band for the quantum well.

A fourth aspect of the invention provides a method of fabricating a group III nitride semiconductor structure, the method comprising: designing a superlattice layer including a quantum well and an immediately adjacent barrier to facilitate a real space transfer of holes across the immediately adjacent barrier, wherein the designing includes: selecting a target valence band discontinuity between the quantum well and the immediately adjacent barrier such that a dopant energy level of a barrier dopant in the immediately adjacent barrier is at least one of: within three thermal energies of a valence energy band edge for the quantum well or substantially aligned with a ground state energy for free carriers in a valence energy band for the quantum well; and selecting a target thickness of each of the quantum well and the adjacent barrier based on a characteristic size of a wave function for the dopant in the immediately adjacent barrier, wherein the target thickness is less than the characteristic size; and forming the quantum well and the adjacent barrier in the structure using group III nitride materials having an actual valence band discontinuity corresponding to the target valence band discontinuity, and actual thicknesses equal to or less than the target thicknesses.

A fifth aspect of the invention provides a device comprising: a radiation generating structure; and a group III nitride superlattice layer located adjacent to the radiation generating structure, wherein the superlattice layer is at least partially transparent to radiation generated by the radiation generating structure, and wherein the superlattice layer comprises: a plurality of quantum wells; and a plurality of barriers alternating with the plurality of quantum wells, wherein a quantum well of the plurality of quantum wells and an immediately adjacent barrier of the plurality of barriers are formed of group III nitride materials having a valence band discontinuity such that a dopant energy level of a barrier dopant in the immediately adjacent barrier is at least one of: within three thermal energies of a valence energy band edge for the quantum well or substantially aligned with a ground state energy for free carriers in a valence energy band for the quantum well and thicknesses equal to or less than a characteristic size of a wave function for the dopant in the immediately adjacent barrier.

A sixth aspect of the invention provides a method of fabricating a deep ultraviolet light emitting device, the method comprising: forming a deep ultraviolet light generating structure; and forming a group III nitride superlattice layer located adjacent to the radiation generating structure, wherein the superlattice layer comprises: a plurality of quantum wells; and a plurality of barriers alternating with the plurality of quantum wells, wherein a quantum well of the plurality of quantum wells and an immediately adjacent barrier of the plurality of barriers are formed of group III nitride materials having a valence band discontinuity such that a dopant energy level of a barrier dopant in the immediately adjacent barrier is at least one of: within three thermal energies of a valence energy band edge for the quantum well or substantially aligned with a ground state energy for free carriers in a valence energy band for the quantum well and thicknesses equal to or less than a characteristic size of a wave function for the dopant in the immediately adjacent barrier.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION

As indicated above, aspects of the invention provide a solution for designing and/or fabricating a structure including a quantum well and an adjacent barrier. A target band discontinuity between the quantum well and the adjacent barrier is selected to coincide with an activation energy of a dopant for the quantum well and/or barrier. For example, a target valence band discontinuity can be selected such that a dopant energy level of a dopant in the adjacent barrier coincides with a valence energy band edge for the quantum well and/or a ground state energy for free carriers in a valence energy band for the quantum well. Additionally, a target doping level for the quantum well and/or adjacent barrier can be selected to facilitate a real space transfer of holes across the barrier. The quantum well and the adjacent barrier can be formed such that the actual band discontinuity and/or actual doping level(s) correspond to the relevant target(s). The resulting structure can provide a lower activation energy for the dopant in the barrier, which can result from a more efficient real space transfer of holes from the dopant (e.g., acceptor) energy level in the barrier into the adjacent quantum well during operation of a corresponding device. As used herein, unless otherwise noted, the term "set" means one or more (i.e., at least one) and the phrase "any solution" means any now known or later developed solution.

Figure 1:
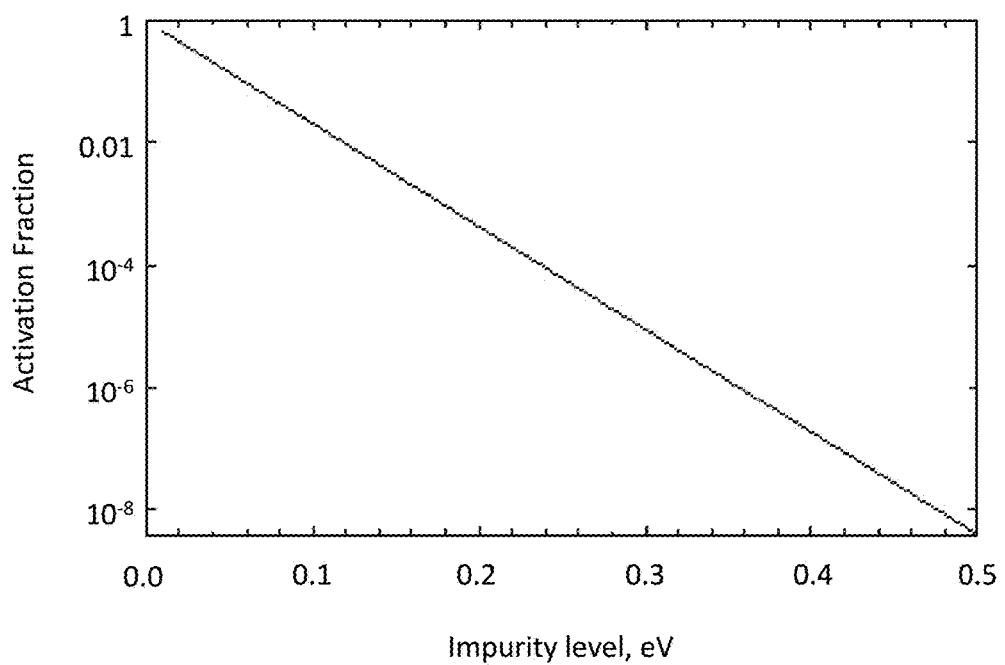
FIG. 1 shows an illustrative fraction of activated impurities as a function of the impurity level in AlGaN as shown in the prior art.
Figure 2:
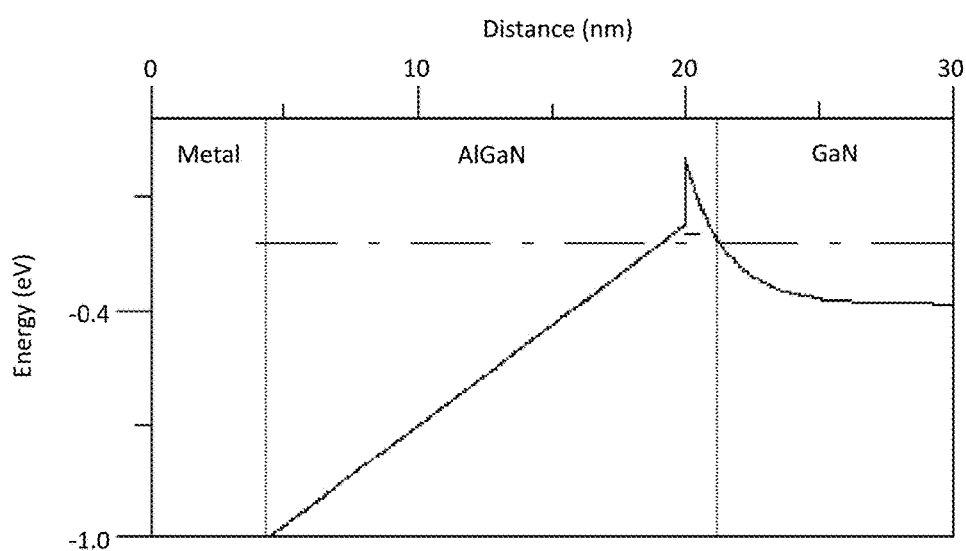
FIG. 2 shows an illustrative band diagram of a metal/AlGaN/GaN n-polar heterostructure as shown in the prior art.
Figure 3A:
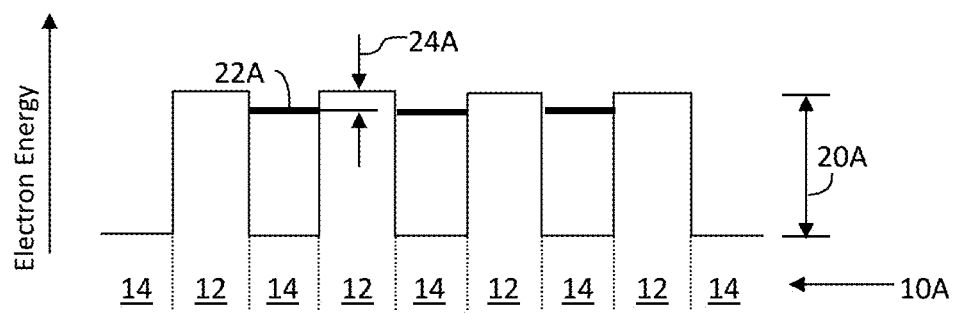
FIGS. 3A and 3B show valence band diagrams of illustrative superlattice layers according to an embodiment.
Figure 3B:
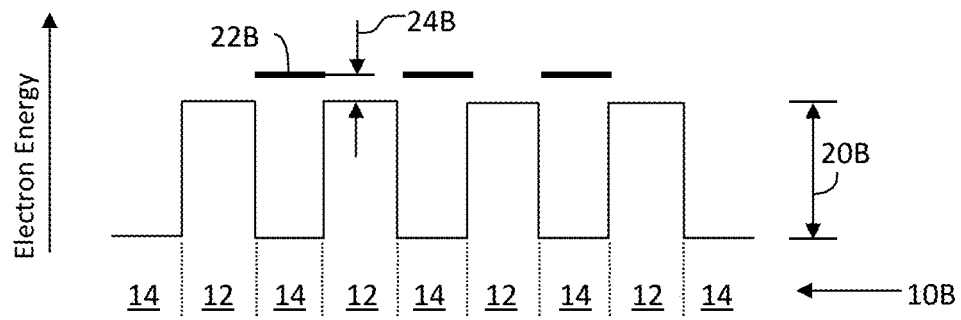

Turning to the drawings, FIGS. 3A and 3B show valence band diagrams of illustrative superlattice layers 10A, 10B, respectively, according to an embodiment. Each superlattice layer 10A, 10B includes interlaced sets of barriers 14 and quantum wells 12. To this extent, each quantum well 12 in the superlattice layers 10A, 10B has one or more adjacent barriers 14 and each barrier 14 in the superlattice layers 10A, 10B has one or more adjacent quantum wells 12.

The barriers 14 and quantum wells 12 in the superlattice layers 10A, 10B are formed using different material compositions. While superlattice layers 10A, 10B are shown having p-type barriers 14 and quantum wells 12, it is understood that barriers 14 and quantum wells 12 can comprise an n-type or a p-type composition depending on the desired functionality of the superlattice layer 10A, 10B in the structure/device. In an illustrative embodiment, the barriers 14 and quantum wells 12 are formed using differing wide band gap semiconductor materials, such as differing group III nitride material compositions. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements. In a more specific illustrative embodiment, each barrier 14 comprises an aluminum gallium nitride (AlGaN) composition comprising a molar fraction of aluminum that can be expressed as $Al_x Ga_{1-x}N$, and each quantum well 12 comprises an AlGaN composition comprising a molar fraction of aluminum that can be expressed as $Al_y Ga_{1-y}N$. In a still more specific illustrative embodiment, each quantum well 12 and barrier 14 comprises a large aluminum molar fraction. Regardless, the differing compositions of the barriers 14 and quantum wells 12 in the superlattice layers 10A, 10B form a series of valence band discontinuities 20A, 20B between each adjacent barrier 14 and quantum well 12 pair in the superlattice layers 10A, 10B, respectively.

Additionally, each quantum well 12 and/or barrier 14 can be doped with a dopant during its formation. The dopant can be selected based on the material composition of the quantum well 12 and/or barrier 14 and the desired functionality to be provided by adding the dopant. For example, a different dopant can be selected based on whether the material composition is a p-type or an n-type composition. In an illustrative embodiment, the dopant is selected to add acceptor atoms to a p-type quantum well 12 and/or barrier 14 to form p-type regions within the quantum well 12 and/or barrier 14. The acceptor atoms in the barrier 14 create a corresponding acceptor level 22A, 22B of energy within the barrier 14. Illustrative dopants for p-type group III nitride materials include magnesium (Mg) and beryllium (Be), while illustrative dopants for n-type group III nitride materials comprise silicon (Si), carbon (C) on Ga site, oxygen (O) on N site and nitrogen vacancy ($V_N^{3+}$).

An effective activation energy 24A, 24B for the dopant in the barrier 14 comprises a difference between the acceptor level 22A, 22B, respectively, within the barrier 14 and an energy band edge at a top of the valence band of the adjacent quantum well(s) 12. In an embodiment, a target band discontinuity for the superlattice layers 10A, 10B is selected to coincide (e.g., align or substantially align) with the activation energy of the dopant for the quantum well 12. For example, a target valence band discontinuity 20A, 20B can be selected such that the acceptor level 22A, 22B, respectively, in the barrier 14 coincides with a valence energy band edge for the adjacent quantum well 12.

The target valence band discontinuity 20A, 20B can be obtained, for example, by adjusting a molar fraction of one or more elements in each of the quantum well 12 and the barrier 14 according to the target valence band discontinuity. To this extent, for the embodiment in which each barrier 14 comprises $Al_x Ga_{1-x}N$ and each quantum well comprises $Al_y Ga_{1-y}N$, a difference in the molar fractions of aluminum (y-x) can be selected to provide the target valence band discontinuity 20A, 20B. As a result, the effective activation energy 24A, 24B (e.g., the activation energy for the transition from the acceptor level in the barrier to the quantum well) of the dopant (e.g., acceptor) is substantially reduced over previous approaches. FIG. 3A illustrates a positive activation energy 24A, while FIG. 3B illustrates a negative activation energy 24B. In an illustrative embodiment, the activation energy 24A, 24B is close to the top of the quantum well 12, making the dopant energy level "in resonance" with the energy band edge in the wide band gap semiconductor (e.g., the barrier 14). In a more specific illustrative embodiment, the valence energy band edge for the quantum well 12 and the dopant energy levels 22A, 22B are within (i.e., less than or equal to) approximately three thermal energies (i.e., within a thermal energy of $3 kT \approx 0.078$ eV at room temperature).

Figure 4:
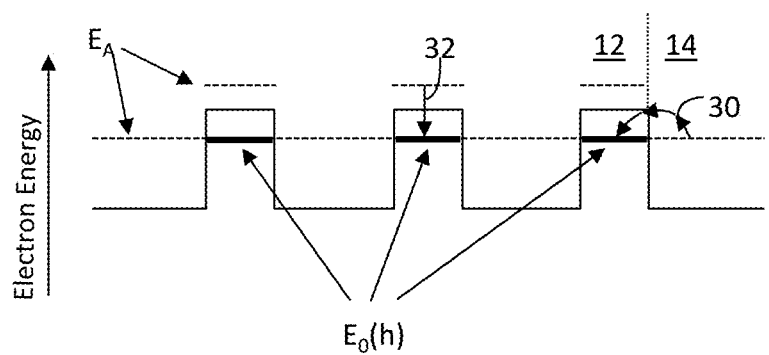
FIG. 4 shows an illustrative valence band diagram illustrating the real space transfer of holes from a barrier into an adjacent quantum well according to an embodiment.

A low effective activation energy 24A, 24B of the dopant in the barriers 14 can enable a more efficient real space transfer of holes from the dopant (e.g., acceptor) energy levels in the barriers 14 into the adjacent quantum wells 12 during operation of a device including a superlattice layer 10A, 10B, respectively. To this extent, a target valence band discontinuity 20A, 20B can be selected such that the acceptor level 22A, 22B, respectively, in the barrier 14 coincides with a ground state energy for free carriers in a valence energy band for the quantum well 12. For example, FIG. 4 shows an illustrative valence band diagram illustrating the real space transfer 30 of holes from a barrier 14 into an adjacent quantum well 12 according to an embodiment. Holes also can move from a quantum well 12 into an adjacent barrier 14 along the same direction. As illustrated in FIG. 4, an acceptor level energy position, $E_A$, in the barrier 14 is substantially aligned with a ground state energy level, $E_0(h)$, of free carriers within the quantum well 12, making the real space transfer 30 easier to achieve. For example, the real space transfer 30 can result from a positive activation energy 24A as shown in FIG. 3A, which can be less than the thermal activation energy required to trigger thermionic emission 32 of holes within a quantum well 12.

Returning to FIGS. 3A and 3B, the formation of the barriers 14 and the quantum wells 12 of the superlattice layers 10A, 10B can be further configured to enhance conductivity of the superlattice layers 10A, 10B and/or increase an effective level of the quantum well 12 and/or barrier 14 doping. In an embodiment, a target thickness of each of the barriers 14 and the quantum wells 12 can be selected to be less than a characteristic size of an impurity wave function. It is understood that a thickness of a barrier/quantum well comprises the distance between the barrier(s)/quantum well(s) immediately adjacent to the barrier/quantum well in a direction perpendicular to the flow of current across the barrier/quantum well.

Figure 5A:
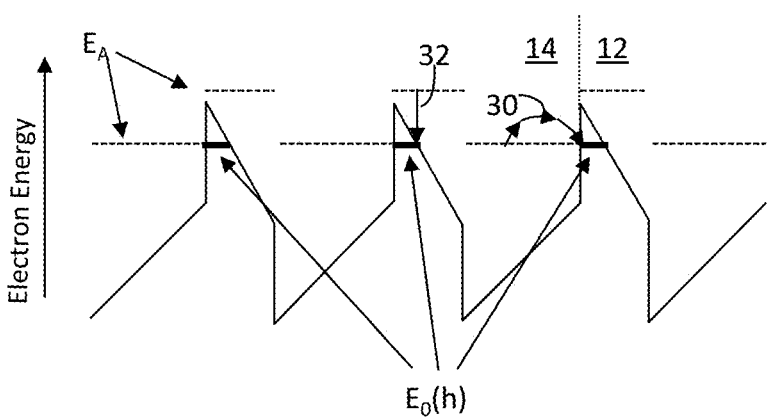
FIGS. 5A and 5B show illustrative valence band diagrams, which account for the affect of polarization charges, according to embodiments.

Polarization charges can significantly change the illustrative band diagrams shown herein. To this extent, FIG. 5A shows an illustrative valence band diagram, which accounts for the affect of polarization charges, according to an embodiment. As illustrated, the real space transfer 30 can more readily occur for thin barriers 14 and quantum wells 12.

The target thickness can be selected based on an estimate of the characteristic size of the impurity wave function. In an embodiment, for a shallow impurity, the characteristic size of the impurity wave function is estimated using the Bohr radius constant. In another embodiment, for a deep impurity, the target thickness can be selected to be even smaller than the target thickness for shallow impurities. For example, the target thickness can be in a range between a single monolayer and the Bohr radius constant. In any event, each quantum well 12 and barrier 14 can be formed (e.g., grown) with an actual thickness substantially equal to the target thickness.

Figure 5B:
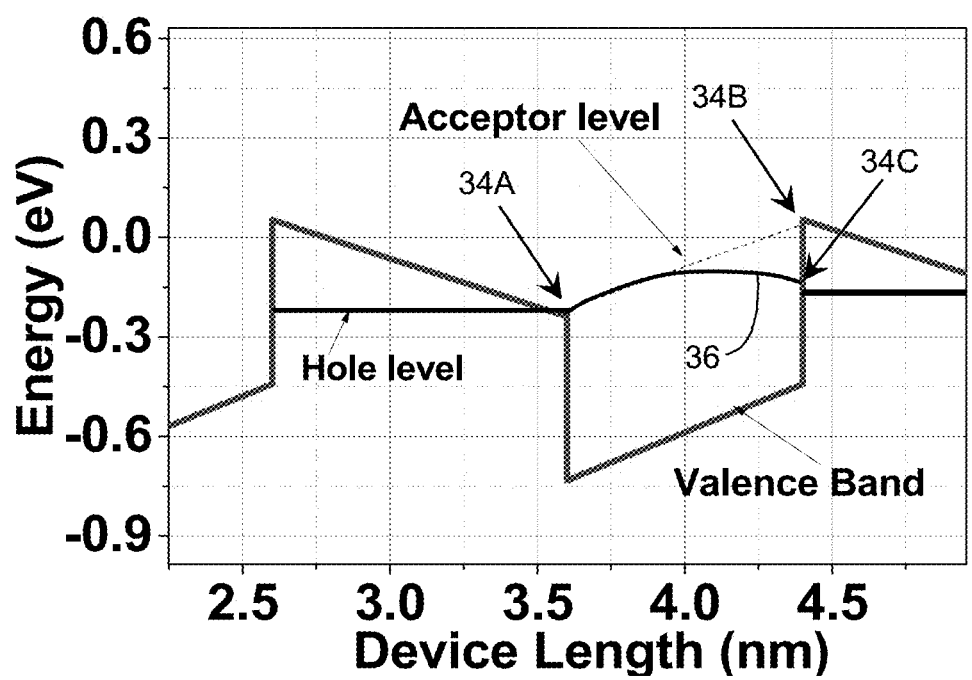

As shown in FIG. 5B, the polarization charges result in the valence band diagram having a inclined profile. Due to the inclined profile, a match (i.e., energy values within +/−0.05 eV) between the acceptor level and hole level at a location 34A does not allow the acceptor level and hole level to match at a location 34B when the acceptor energy level is constant relative to the valence edge (as shown by the dashed line). To modify this, the acceptor energy level can vary relative to the valence edge. For example, the acceptor energy level can be configured to approximately correspond with the solid line 36. The design of a non-constant acceptor line can be accomplished using any combination of one or more approaches. For example, a varying acceptor energy level can be obtained through modification in a dopant concentration (e.g., a lower concentration of dopants can lead to a decrease in acceptor energy) within the barrier. In a more particular example, the dopant concentration within the barrier is at a maximum in the middle of the barrier.

Additionally, another approach includes the addition of co-dopants, such as Si, As, C, and/or the like, with a primary dopant being Mg, or the like. In this case, the co-dopants can be used to achieve a target dopant energy level. Other approaches include: localized changes in a molar ratio of the semiconductor layer comprising the barrier; structuring an interface between the barrier and quantum well; and/or the like. To this extent, structuring the interface between a quantum well and a barrier can include, for example, adding a compositional grading to one or both of the quantum well and barrier. Such grading can be across all of the quantum well and/or barrier, or only over a portion of the quantum well and/or barrier. Regardless, the modification of the structure to result in a varying acceptor energy level can be configured to provide for an improved matching of the acceptor levels and the hole levels at the location 34C.

The superlattice layers 10A, 10B shown and described herein can be implemented as part of a structure for various types of devices. In particular, the superlattice layers 10A, 10B can be utilized to create a layer in a device structure where a very high hole/electron density is desired. Various types of devices implemented with wide band gap structures, such as group III nitrides, can include a superlattice layer 10A, 10B fabricated as described herein as one or more of: a contact layer, an intermediate layer, an active layer, and/or the like. For example, a device can comprise one or more ohmic contacts, which incorporates a superlattice layer 10A, 10B shown and described herein as a contact layer. Similarly, various group III nitride-based devices, such as a light emitting diode (LED), a superluminescent diode, a laser, a photodetector, a Schottky diode, and/or the like, can incorporate a superlattice layer 10A, 10B as shown and described herein as an intermediate layer. Still further, additional group III nitride-based devices, such as a heterostructure field effect transistor, a bipolar junction transistor, a switch, a radio frequency switch, and/or the like, can incorporate a superlattice layer 10A, 10B as shown and described herein as an intermediate layer. While shown and described herein with respect to the fabrication of a superlattice layer, it is understood that an embodiment of the invention can be applied to the fabrication of a heterostructure comprising a set of quantum wells and a set of barriers.

Figure 6A:
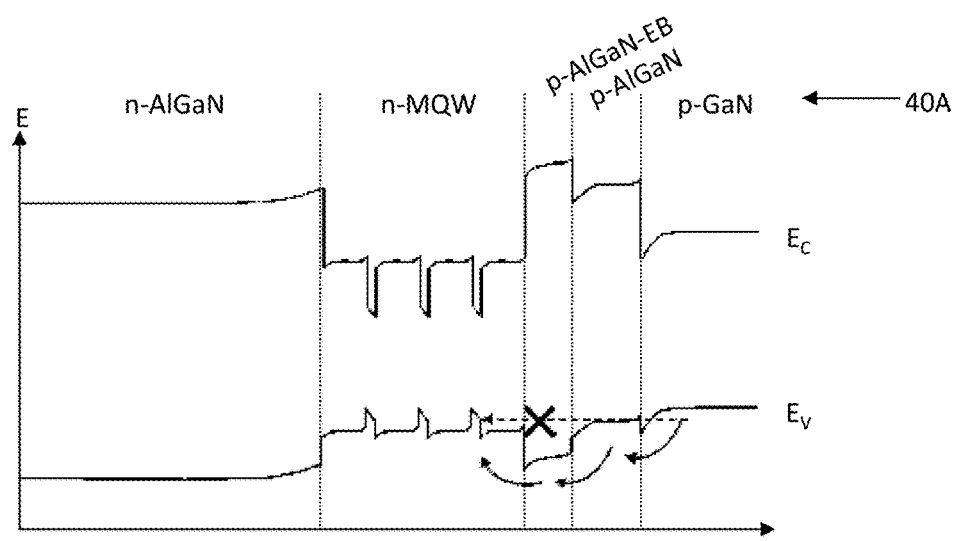
FIGS. 6A and 6B show illustrative band diagrams illustrating injection during operation of a device according to the prior art and a device according to an embodiment, respectively.
Figure 6B:
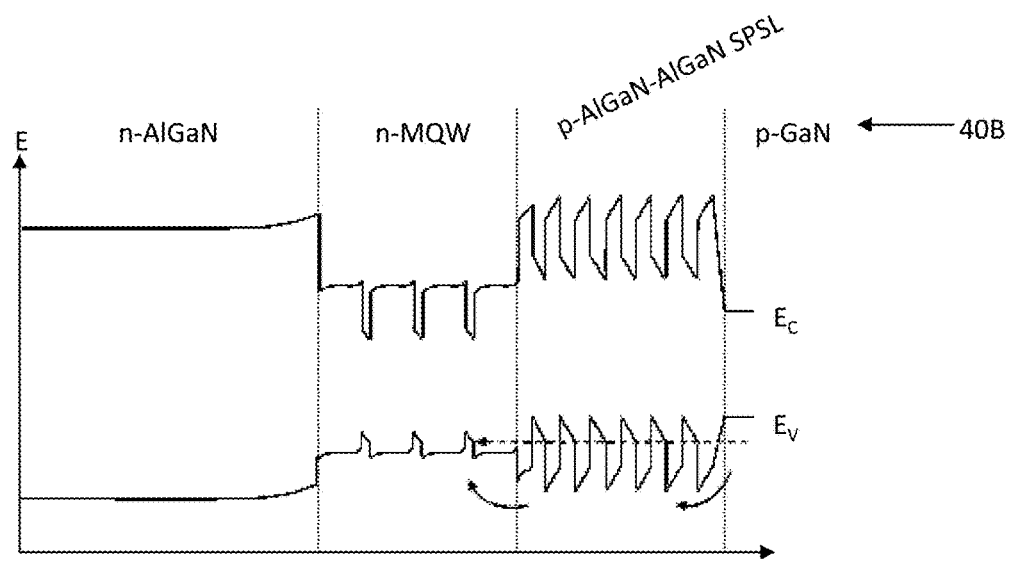

In an embodiment, a deep ultraviolet (UV) light emitting diode (LED) includes an intermediate superlattice layer 10A, 10B having extremely thin barriers 14 and quantum wells 12, which enable the injection of holes via a resonant tunneling mechanism during operation of the deep UV LED. For example, FIGS. 6A and 6B show illustrative band diagrams illustrating injection into an active multiple quantum well (MQW) structure during operation of a device 40A according to the prior art and a device 40B according to an embodiment, respectively. Both devices 40A, 40B are configured to operate as a deep UV LED. In FIG. 6A, the deep UV LED 40A comprises a standard n-AlGaN/n-MQW/p-AlGaN-EB/p-AlGaN/p-GaN structure. As illustrated in FIG. 6A, injection into the multiple quantum well (MQW) structure occurs only via thermionic emission (indicated by solid line arrows) from the adjacent electron blocking (EB) layer. In contrast, the deep UV LED 40B of FIG. 6B comprises a n-AlGaN/n-MQW/p-AlGaN—AlGaN SPSL/p-GaN structure. As illustrated in FIG. 6B, injection into the MQW structure occurs by both thermionic emission (indicated by solid line arrows) as well as resonant tunneling (indicated by dashed line arrow) from the adjacent short period superlattice layer (SPSL) according to an embodiment. To this extent, the injection/resonant tunneling of holes can occur from a p-type metal contact through a p-type contact layer and/or p-type cladding layers.

Returning to FIGS. 3A and 3B, target doping levels for a dopant in the quantum wells 12 and for a dopant in the barriers 14 can be selected to, along with the target valence band discontinuity, facilitate the real space transfer of holes across the barriers 14. In an embodiment, the quantum wells 12 and barriers 14 are doped using silicon (Si). Si comprises a shallow dopant (e.g., ionization energy of approximately 30-50 meV). In the superlattice layer 10A, 10B, a conduction band offset between the barriers 14 and quantum wells 12 can be designed to be greater than approximately 100 meV. In this case, no alignment between a donor level and an electron ground state in the quantum wells 12 would be expected. In an embodiment, the formation of a quantum well 12 includes modulation doping the quantum well 12 using, for example, band bending, polarization discontinuity, p-dopant modulation, and/or the like, to obtain an actual quantum well doping level corresponding to the target doping level.

Furthermore, the quantum wells 12 and/or barriers 14 can comprise a graded composition, which changes in a direction substantially perpendicular to a long axis of the quantum wells 12 and barriers 14. Such a graded composition can be configured to, for example, reduce/minimize a polarization induced electric field within the superlattice layer 10A, 10B (e.g., as shown in FIG. 5). In an embodiment, the quantum wells 12 and/or barriers 14 can be formed of AlGaN materials, and the grading can comprise a change in Al composition over the width of a quantum well 12 and/or barrier 14. For a quantum well 12 and/or a barrier 14 having a small width, a relatively small change in the Al composition can significantly reduce the polarization induced electric field. The grading can be configured to reduce the polarization field in the conduction or the valence band. For a reduction of the electric field in the valence band, the Al composition can increase in the quantum well 12 and decrease in the barrier 14 in the direction of the current (e.g., opposite to the growth direction).

As discussed herein, superlattice layer 10A, 10B can comprise a short period superlattice (SPSL), a combination of short period and long period superlattices (e.g., including Bragg reflector structures), and/or the like. The SPSL comprises multiple periods, each of which can include a quantum well 12 and a barrier 14. Similarly, a period can itself comprise a sub-SPSL, which is made up of its own set of periods. For example, a quantum well 12 and/or barrier 14 in a period can be formed from a plurality of sub-layers. In an embodiment, a width and/or a composition of the periods in the SPSL changes in a direction substantially perpendicular to a long axis of the quantum wells 12 and barriers 14 in each period. Such a configuration can be used, for example, to reduce an amount of strain by providing a gradual transition from a first type of material on one side of the superlattice layer 10A, 10B to a second type of material on the second side of the superlattice layer 10A, 10B. In an embodiment, a width (as measured in the direction substantially perpendicular to the long axis of the quantum wells 12 and barriers 14) of quantum wells 12 and/or barriers 14 can increase/decrease from period to period within the superlattice layer 10A, 10B. In another embodiment, a composition of a quantum well 12 and/or barrier 14 can change from period to period. Similarly, when a period includes a sub-SPSL, a number of periods in the sub-SPSL can change from period to period. Regardless, the change in composition and/or width can be relatively small between adjacent periods, but can result in a considerable change in width and/or composition of the quantum wells 12 and/or barriers 14 at opposing ends of the superlattice layer 10A, 10B.

In an embodiment, polarization-based compositional doping of a superlattice layer can be utilized. For example, the superlattice layer can comprise barriers and/or quantum wells of graded compositions. In an embodiment, each barrier and/or each quantum well in the superlattice layer can have a composition different from its neighboring barrier and/or quantum well, respectively. To this extent, the superlattice layer can have changes in composition from one barrier to another and/or from one quantum well to another that are monotonic. Alternatively, the changes in composition from one barrier to another and/or from one quantum well to another can be constant. When the superlattice layer connects a p-type region, which typically has a relatively low molar ratio of aluminum nitride, to another layer, such as an electron blocking layer, having a relatively high molar ratio of aluminum nitride, the barriers and/or quantum wells of the superlattice layer can be graded from low aluminum nitride molar ratios on the p-type regions side to higher aluminum nitride ratios on the side with the other layer having a higher molar ratio of aluminum nitride. In this case, the graded compositions result in a somewhat smooth (e.g., linear) transition from low to high aluminum nitride molar values across the superlattice layer.

The quantum wells 12 and barriers 14 also can be configured to, for example, reduce polarization effects in the superlattice layer 10A, 10B. For example, quantum wells 12 and barriers 14 can be configured to have polarizations (e.g., built-in electric fields) that at least partially cancel one another. For example, a quantum well 12 can comprise a spontaneous polarization having an opposite sign as a spontaneous polarization of adjacent barrier(s) 14. Similarly, a quantum well 12 can comprise a strain-induced polarization having an opposite sign of a strain-induced polarization of adjacent barrier(s) 14. Still further, one type of polarization in a quantum well 12 can have an opposite sign of another type of polarization in adjacent barrier(s) 14, thereby reducing the net polarization present due to a combination of multiple types of polarizations (e.g., spontaneous and strain-induced).

As discussed herein, superlattice layer 10A, 10B can be included in a device configured to emit radiation, such as a light emitting diode, a laser, or the like. In an embodiment, the radiation comprises deep ultraviolet radiation and the device comprises a deep UV LED having a peak emission wavelength shorter than approximately 365 nanometers. To this extent, a superlattice layer 10A, 10B can be configured to be at least partially transparent (e.g., semi-transparent or transparent) to a range of radiation wavelengths, which includes the peak emission wavelength for the emitted radiation (e.g., peak emission wavelength+/−five nanometers). As used herein, a layer is at least partially transparent to radiation if it allows more than approximately 0.001 percent of the radiation to pass there through. In a more particular embodiment, an at least partially transparent layer is configured to allow more than approximately five percent of the radiation to pass there through.

Quantum wells 12 and barriers 14 at least partially transparent to the radiation can be formed using any solution. For example, a transparent quantum well 12 and/or barrier 14 can comprise a p-type layer formed of a group III nitride material described herein. Illustrative at least partially transparent group-III nitride materials include AlGaN, AlInGaN, boron-containing alloys (GaBN, AlBN, AlGaBN, AlInGaBN, InGaBN, and/or the like), and/or the like. The at least partial transparency of a layer can be achieved using any solution. For example, at least partial transparency can be achieved in materials with bandgaps smaller than a photon energy of the radiation due to tunneling, thermionic transport via impurity states, and/or the like.

Figure 7:
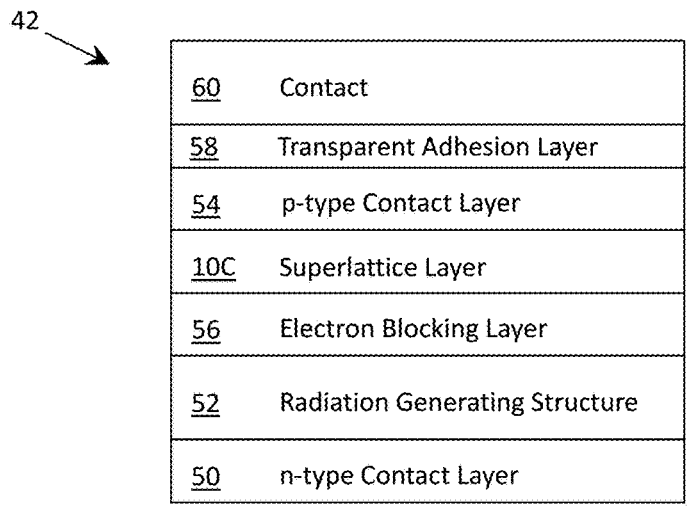
FIG. 7 shows an illustrative light emitting device structure according to an embodiment.

FIG. 7 shows an illustrative light emitting device structure 42 according to an embodiment. As illustrated, the device structure 42 comprises an n-type contact layer 50 adjacent to a radiation generating structure 52. Radiation generating structure 52 can comprise any type of structure, such as a multiple quantum well structure, for generating any type of radiation, such as ultraviolet light. Furthermore, device structure 42 includes a p-type contact layer 54 on an opposing side of the radiation generating structure 52 as the n-type contact layer 50.

The device structure 42 further includes a superlattice layer 10C, which can be formed as described herein. Superlattice layer 10C is shown located on the same side of the radiation generating structure 52 as the p-type contact layer 54. In an embodiment, the superlattice layer 10C is at least partially transparent to radiation generated by radiation generating structure 52.

The device structure 42 also can include an electron blocking layer 56, which can be located between the superlattice layer 10C and the radiation generating structure 52. In an embodiment, the electron blocking layer 56 has a thickness in a range between approximately two and approximately one hundred nanometers. The electron blocking layer 56 can comprise a p-type composition having a larger band gap than the barrier(s) 14 located within the superlattice layer 10C, which can result in an improved transparency of the electron blocking layer 56 to radiation generated by the radiation generating structure 52. Furthermore, the electron blocking layer 56 can comprise a graded composition, which can be configured to decrease a resistance of the electron blocking layer 56. For example, the electron blocking layer 56 can have a graded doping that increases or decreases by approximately $10^4$ cm$^{-3}$, e.g., between approximately $10^{16}$ and approximately $10^{20}$ cm$^{-3}$. Alternatively, the electron blocking layer 56 can have a homogeneous doping within the range of approximately $10^{16}$ and approximately $10^{20}$ cm$^{-3}$.

In an illustrative embodiment, the p-type contact layer 54 can be formed of $Al_xGa_{1-x}N$, with x<0.3 and the superlattice layer 10C can be located immediately adjacent to the p-type contact layer 54 and the electron blocking layer 56 or the radiation generating structure 52 having a higher aluminum molar fraction. In this case, the superlattice layer 10C can comprise barriers and/or quantum wells of graded compositions as described herein, which can provide a transition from the composition of the electron blocking layer 56 or the radiation generating structure 52 on one side to the composition of the p-type contact layer 54 on the other side.

The device structure 42 can include a contact 60. Contact 60 can comprise any type of contact. In an embodiment, the contact 60 comprises a p-type metal contact, such as a Schottky contact, a leaky Schottky contact, a rectifying contact, and/or the like. In a more specific embodiment, the contact 60 at least partially reflects the radiation generated by the radiation generating structure 52 and can be formed from, among other things, aluminum, enhanced aluminum, aluminum silicon monoxide, aluminum magnesium fluoride, rhodium, enhanced rhodium, gold, and/or the like. In another more specific embodiment, the contact 60 is at least partially transparent to the radiation generated by the radiation generating structure 52 and can be formed from, among other things, a metallic superlattice, in which each layer is at least partially transparent to the radiation. In either case, the contact 60 can be directly adjacent to a transparent adhesion layer 58. The transparent adhesion layer 58 can be configured to improve ohmic properties of the contact 60 and promote adhesion of the contact 60 to a surface of the semiconductor (e.g., layer 54). In an embodiment, the transparent adhesion layer 58 is formed of nickel. However, it is understood that transparent adhesion layer 58 can be formed of any suitable material, including Nickel oxyhydroxide (NiOx), Palladium (Pd), Molybdenum (Mo), Cobalt (Co), and/or the like.

The various layers in the device structure 42 can be formed using any type of materials. In an embodiment, the device structure 42 comprises a group III nitride-based heterostructure, in which one or more of the layers 50, 56, 10C, and 54 and radiation generating structure 52 are formed of various group III nitride materials using any solution. Additionally, contact 60 can be implemented without a transparent adhesion layer 58, and be formed of one or more layers of metal, such as for example, one or more layers of titanium, aluminum, gold, chromium, nickel, platinum, lead, rhodium, and/or the like.

In an embodiment, one or more of the contacts 50, 54, 60 comprises graphene, which can be configured to be transparent to radiation generated by the radiation generating structure 52 and very conductive. For example, the p-type contact layer 54 to the superlattice layer 10C and/or contact 60 can be at least partially formed of p-type graphene. Similarly, the n-type contact layer 50 can be at least partially formed of n-type graphene. In an embodiment, a contact 50, 54, 60 comprises a graphene composite contact, which includes a graphene sub-layer adjacent to a thin sub-layer of metal, which can improve current spreading in the contact 50, 54, 60. In a further embodiment, the graphene composite contact is at least partially transparent to the radiation generated by the radiation generating structure 52. It is understood that the device structure 42 can include one or more layers, such as transparent adhesion layer 58 and/or contact 60, adjacent to a contact formed of graphene, such as contact 54, which are configured to improve light extraction from the device structure 42, e.g., via a textured surface.

In an embodiment, a structure described herein can include one or more layers having a composition selected such that the layer has a transparency of at least a target transparency to radiation, such as ultraviolet radiation, of a target set of wavelengths. The layer can comprise, for example, a p-type contact layer 54 (FIG. 7), an electron blocking layer 56 (FIG. 7), a superlattice layer 10C (FIG. 7), and/or the like. For example, a layer can be a group III nitride-based layer, which is composed of $Al_xGa_{1-x}N$ where the aluminum molar fraction (x) is sufficiently high in some domains of the layer to result in the layer being at least partially transparent to ultraviolet radiation. In an embodiment, the layer can comprise a superlattice layer located in an emitting device configured to emit radiation having a dominant wavelength in the ultraviolet spectrum, and the composition is configured to be at least partially transparent to ultraviolet radiation having a target wavelength corresponding to the ultraviolet radiation emitted by the emitting device.

An amount of transparency of a short period superlattice (SPSL) can be approximated by computing an averaged band gap of the SPSL, and deducing average absorption coefficients of the SPSL. The absorption coefficients depend on an absorption edge of the semiconductor material, which for materials formed of an AlGaN alloy, is a function of the molar fractions of the $Al_xGa_{1-x}N$ semiconductor alloy.

In an embodiment, the target transparency for the material is at least ten times more transparent than the least transparent layer of material in the structure (e.g., GaN for a group III nitride-based device). In this case, an absorption coefficient of the semiconductor layer can be on the order of $10^4$ inverse centimeters or lower. In this case, a one micron thick semiconductor layer will allow approximately thirty-six percent of the ultraviolet radiation to pass there through.

Figure 8:
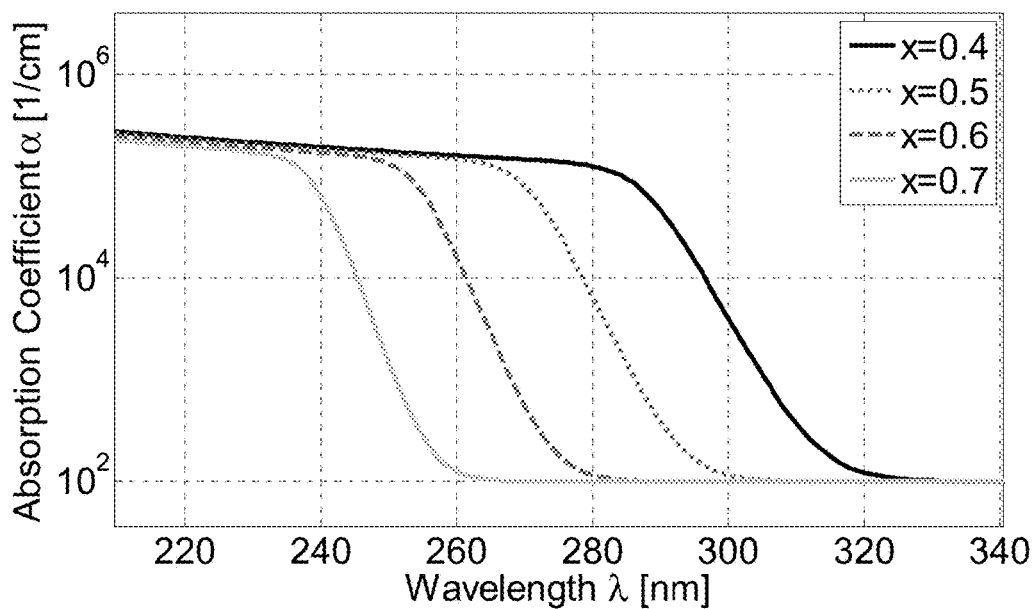
FIG. 8 shows a dependence of the absorption coefficient on the wavelength for various aluminum molar fractions (x) of an $Al_xGa_{1-x}N$ alloy according to an embodiment.
Figure 9:
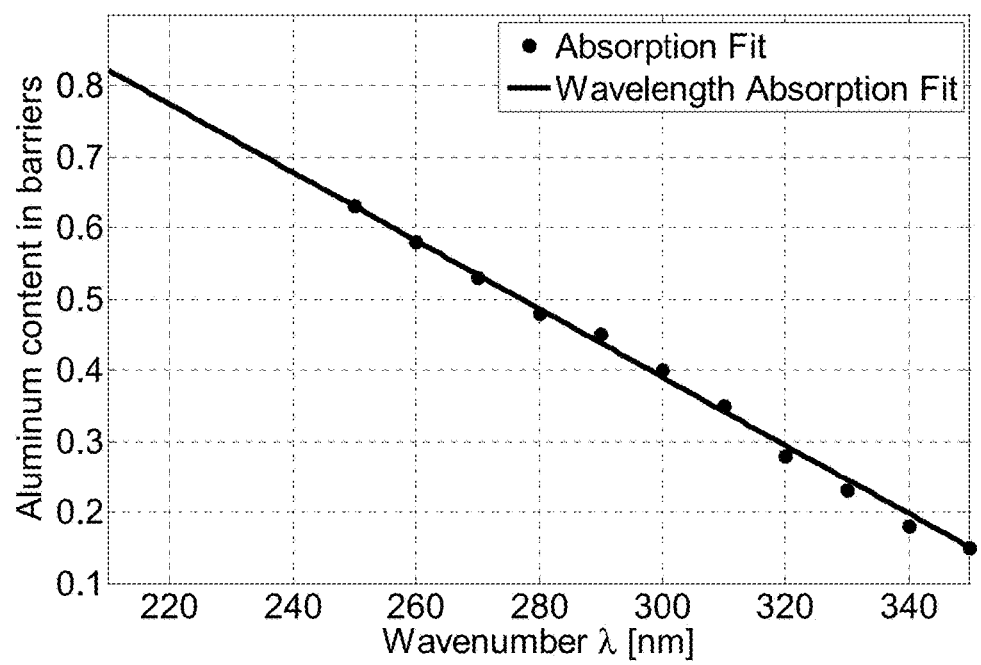
FIG. 9 shows an illustrative chart for selecting an aluminum content of an AlGaN alloy to maintain a target transparency for a corresponding emitted wavelength according to an embodiment.

FIG. 8 shows a dependence of the absorption coefficient on the wavelength for various aluminum molar fractions (x) of an $Al_xGa_{1-x}N$ alloy according to an embodiment. In order to maintain an absorption coefficient of the semiconductor layer at orders of $10^4$ inverse centimeters or lower, the content of aluminum in an SPSL barrier layer can be chosen based on the corresponding target wavelength or range of wavelengths. For example, for a target wavelength of approximately 250 nanometers, the aluminum molar fraction can be approximately 0.7 or higher, whereas for a target wavelength of approximately 300 nanometers, the aluminum molar fraction can be as low as approximately 0.4. FIG. 9 shows an illustrative chart for selecting an aluminum content of an $Al_xGa_{1-x}N$ alloy to maintain a target transparency for a corresponding emitted wavelength, $\lambda$, according to an embodiment. Note that in FIG. 9, the dependence of $x=x(\lambda)$ is linear, with $x=C \cdot \lambda+B$, where $C=-0.0048$ [1/nm], and $B=1.83$.

In an embodiment, a device can include one or more layers with lateral regions configured to facilitate the transmission of radiation through the layer and lateral regions configured to facilitate current flow through the layer. For example, the layer can be a short period superlattice, which includes barriers alternating with wells. In this case, the barriers can include both transparent regions, which are configured to reduce an amount of radiation that is absorbed in the layer, and higher conductive regions, which are configured to keep the voltage drop across the layer within a desired range. As used herein, the term lateral means the plane of the layer that is substantially parallel with the surface of the layer adjacent to another layer of the device. As described herein, the lateral cross section of the layer can include a set of transparent regions, which correspond to those regions having a relatively high aluminum content, and a set of higher conductive regions, which correspond to those regions having a relatively low aluminum content.

The set of transparent regions can be configured to allow a significant amount of the radiation to pass through the layer, while the set of higher conductive regions can be configured to keep the voltage drop across the layer within a desired range (e.g., less than ten percent of a total voltage drop across the structure). In an embodiment, the set of transparent regions occupy at least ten percent of the lateral area of the layer, while the set of higher conductive regions occupy at least approximately two percent (five percent in a more specific embodiment) of the lateral area of the layer. Furthermore, in an embodiment, a band gap of the higher conductive regions is at least five percent smaller than the band gap of the transparent regions. In a more particular embodiment, the transparent regions comprise a transmission coefficient for radiation of a target wavelength higher than approximately sixty percent (eighty percent in a still more particular embodiment), while the higher conductive regions have a resistance per unit area to vertical current flow that is smaller than approximately $10^{-2}$ ohm·cm². As used herein, the term transmission coefficient means the ratio of an amount of radiation exiting the region to an amount of radiation entering the region.

The transparent and conductive regions can be formed using any solution. For example, a layer can be grown using migration-enhanced metalorganic chemical vapor deposition (MEMOCVD). During the growth, inhomogeneities in the lateral direction of a molar fraction of one or more elements, such as aluminum, gallium, indium, boron, and/or the like, can be allowed in the layer. In an embodiment, such compositional inhomogeneities can vary by at least one percent.

Figure 10:
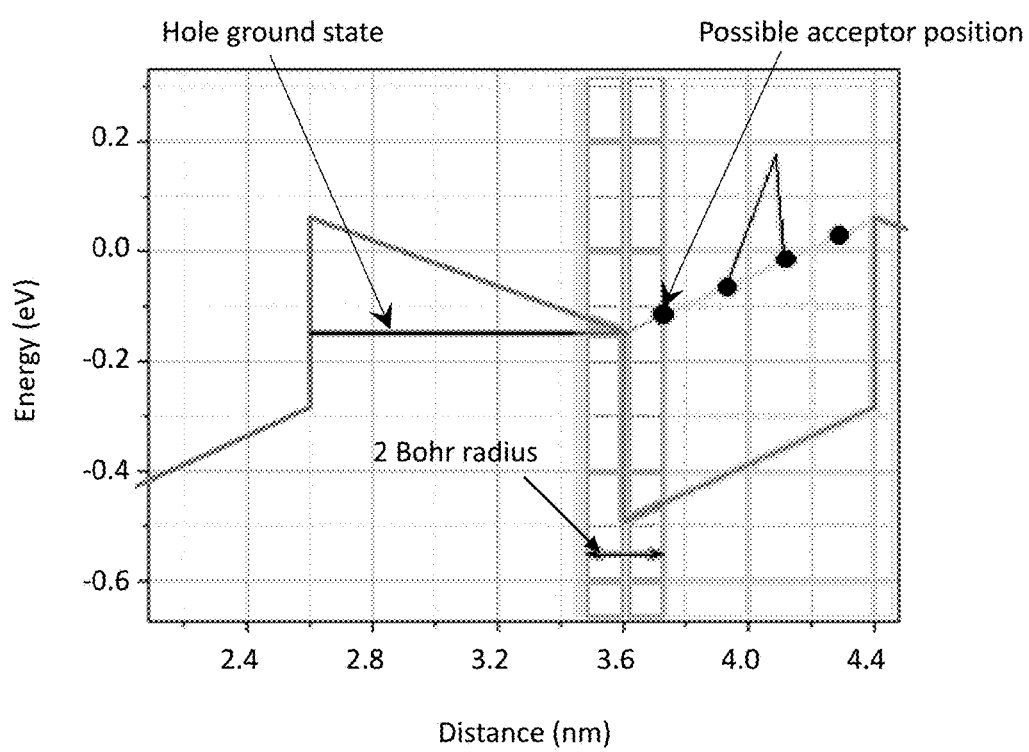
FIG. 10 shows an illustrative valence band diagram of a superlattice structure described herein according to an embodiment.

FIG. 10 shows an illustrative valence band diagram of a superlattice structure described herein according to an embodiment. A ground state energy level for holes in the quantum well is indicated in the figure, as well as possible acceptor levels in an adjacent barrier (indicated by dots). When an acceptor energy level is within a few kT, where k is the Boltzmann constant and T is an operational temperature of the device, of the ground state energy level within a few, e.g., up to ten (three or less in a more particular embodiment), Bohr radiuses of the interface between the barrier and the quantum well, a carrier transfer from the acceptor levels to the ground state of the quantum well is possible.

The Bohr radius, $R_B$, can be calculated for hole carriers. In this case, the Bohr radius is given by $R_B=4\pi\epsilon h^2/m_h e^2$, where $\epsilon$ is the permittivity of the material, $\hbar$ is the reduced Planck's constant, $m_h$ is the hole rest mass, and e is the elementary charge. For the composition $Al_{0.5}Ga_{0.5}N$, the mass of an "average" hole is about four times the electron rest mass ($m_h \sim 4m_e$), the permittivity is approximately nine times the permittivity of free space ($\epsilon \sim 9\epsilon_0$), and the resulting Bohr radius, $R_B$, is approximately 9/4 of the Bohr radius of hydrogen, $R_H$, that is $R_B \sim 1.2$ nm. A group III semiconductor layer having a higher concentration of gallium will have a smaller hole mass (e.g., for GaN, $m_h \sim 1.4$). As a result, such a group III semiconductor layer can have a Bohr radius, $R_B \sim 6 \times R_H = 3.2$ nm.

Figure 11A:
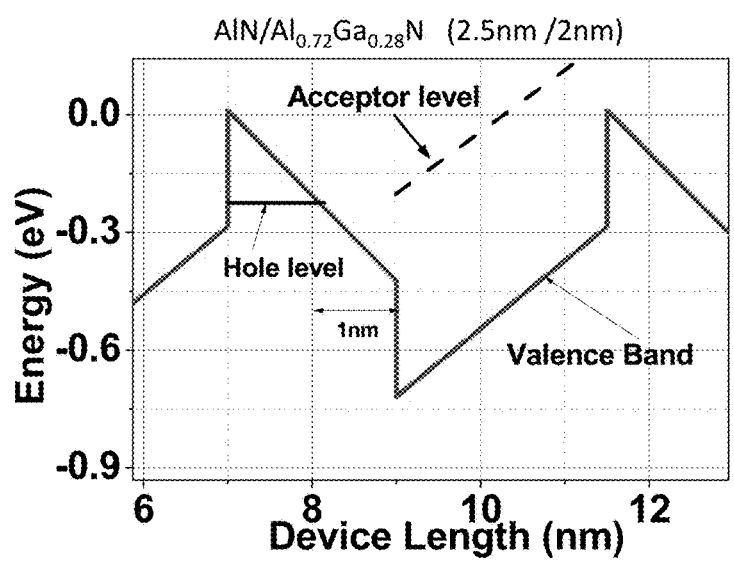
FIGS. 11A-11C show valence band diagrams for several illustrative embodiments of a superlattice structure described herein according to embodiments.
Figure 11B:
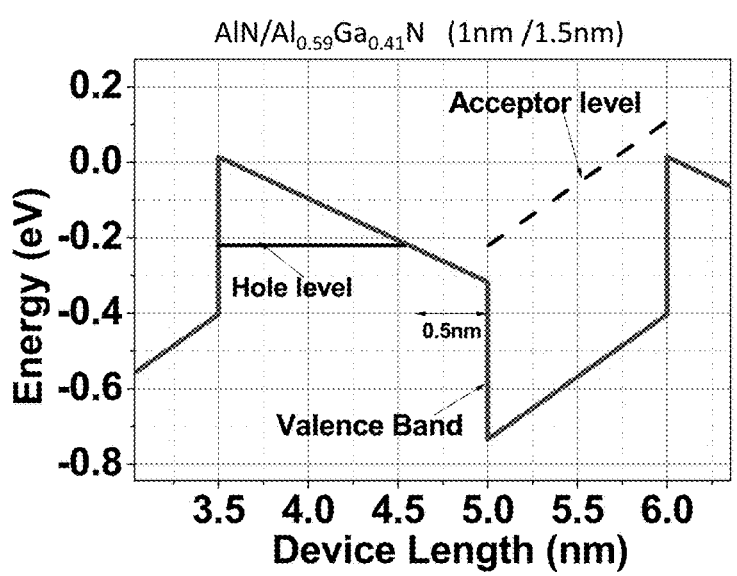
Figure 11C:
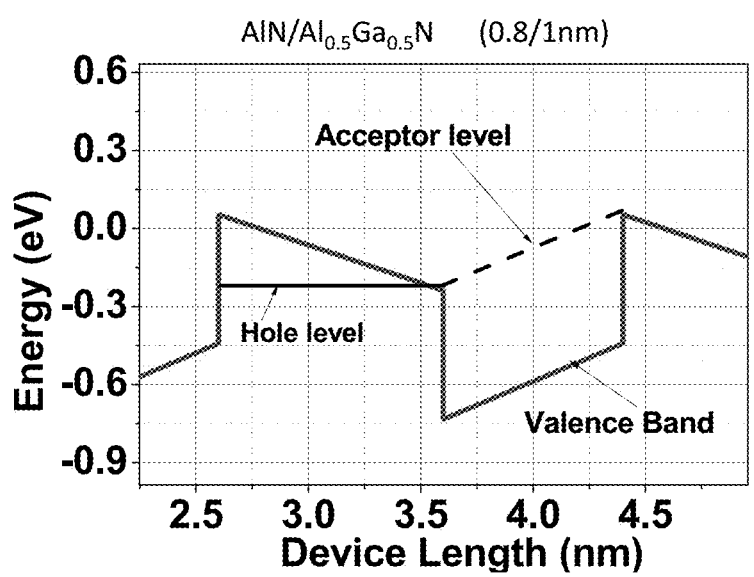

FIGS. 11A-11C show valence band diagrams for several illustrative embodiments of a superlattice structure described herein according to embodiments. In each case, a variation of an aluminum molar fraction in the quantum well and barrier is selected to yield a "resonant condition," in which real space transfer of holes across the barrier is possible. In addition, real space transfer of holes across the barrier is possible when the energy levels of acceptors in the barriers match the ground state energy of holes in the quantum well. To this extent, the barrier can be configured to facilitate the real space transfer of holes from an adjacent quantum well into the barrier as well as from the barrier into another adjacent quantum well.

In FIG. 11A, an AlN barrier having a thickness of 2 nanometers is shown adjacent to an $Al_{0.72}Ga_{0.28}N$ quantum well with a thickness of 2.5 nanometers. In FIG. 11B, an AlN barrier having a thickness of 1 nanometer is shown adjacent to an $Al_{0.59}Ga_{0.41}N$ quantum well with a thickness of 1.5 nanometers. In FIG. 11C, an AlN barrier having a thickness of 0.8 nanometers is shown adjacent to an $Al_{0.5}Ga_{0.5}N$ quantum well with a thickness of 1 nanometer. In each case, the desired resonance condition is achieved by selecting the appropriate thickness and composition of the quantum well and barrier.

Figure 12:
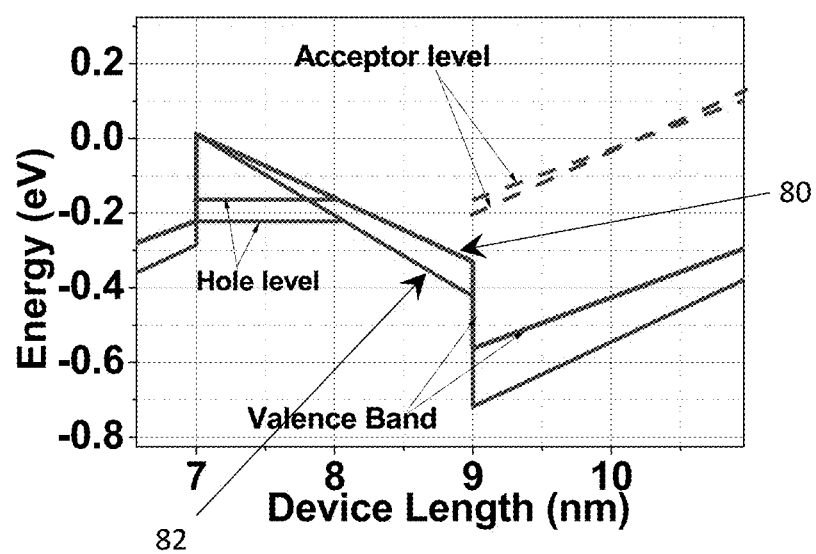
FIG. 12 shows a valance band diagram illustrating two possible resonant conditions for the same quantum well and barrier thicknesses according to an embodiment.

FIG. 12 shows a valance band diagram illustrating two possible resonance conditions for the same quantum well and barrier thicknesses according to an embodiment. In particular, the barrier has an $Al_xGa_{1-x}N$ composition with a thickness of 2.5 nanometers and the quantum well has an $Al_yGa_{1-y}N$ composition with a thickness of 2 nanometers. The band diagram 80 corresponds to x/y values of 0.67/0.4, while the band diagram 82 corresponds to x/y values of 1/0.72. In each case, a resonance condition is achieved, making real space transfer of holes across the barrier possible.

Figure 13:
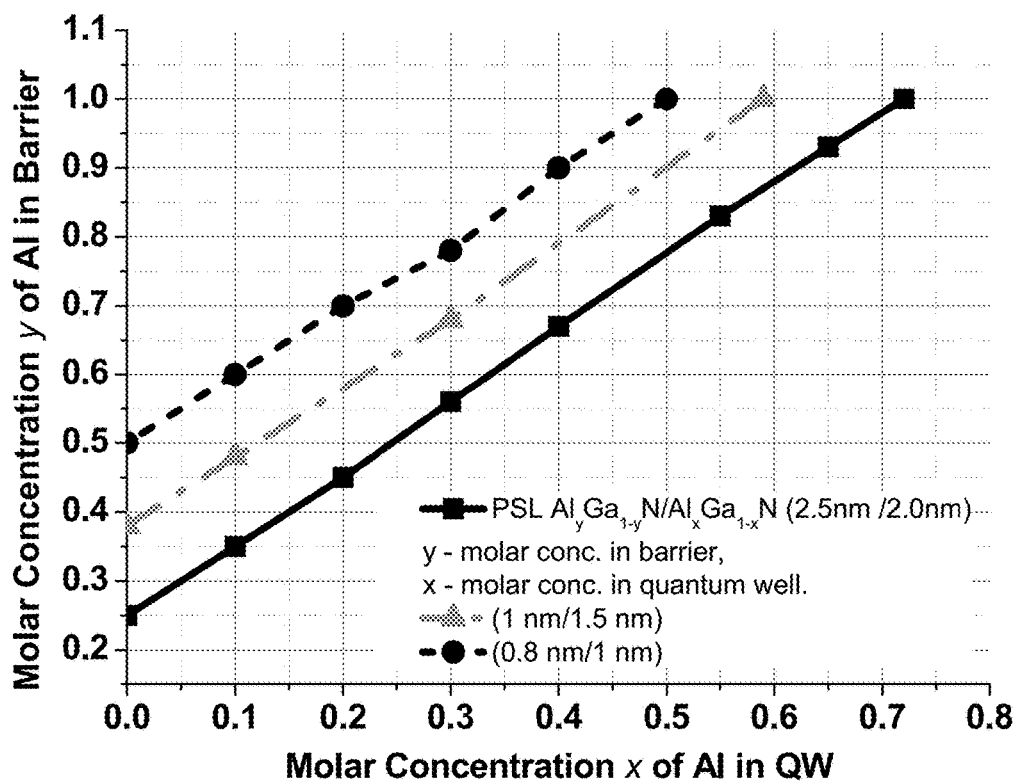
FIG. 13 shows the dependence of the aluminum molar fraction of a barrier as a function of the aluminum molar fraction of a quantum well for several illustrative combinations of barrier and quantum well thicknesses in order to maintain a resonance condition according to an embodiment.

FIG. 13 shows the dependence of the aluminum molar fraction of a barrier as a function of the aluminum molar fraction of a quantum well for several illustrative combinations of barrier and quantum well thicknesses in order to maintain a resonance condition according to an embodiment. As illustrated, the dependence is linear, and can be calculated using a formula: $y_b=Mx_q+N$, where $y_b$ is the molar concentration of Al in the barrier, $x_q$ is the molar concentration of Al in the quantum well, M is approximately one (+/−0.1), and N depends on the thickness of the quantum well and barrier and can vary between approximately 0.2 and approximately 0.7 (between 0.2 and 0.5 in a more particular embodiment).

As illustrated, as the quantum well thickness is reduced, the value of N is increased in a monotonic fashion. In an embodiment, the quantum well thickness is in a range between approximately one and approximately four nanometers. In this case, the molar concentration of aluminum in the barriers can be in a range between approximately 0.2 and approximately 1, and the molar concentration of aluminum in the quantum wells can be in a range between approximately 0 and approximately 0.8. In an embodiment, a difference between an aluminum molar concentration between a barrier and a quantum well is no larger than approximately eighty percent of the barrier aluminum molar concentration.

While shown and described herein as a method of designing and/or fabricating a structure and/or a corresponding semiconductor device including the structure, it is understood that aspects of the invention further provide various alternative embodiments. For example, in one embodiment, the invention provides a method of designing and/or fabricating a circuit that includes one or more of the semiconductor devices designed and fabricated as described herein (e.g., including one or more superlattice layers 10A, 10B).

Figure 14:
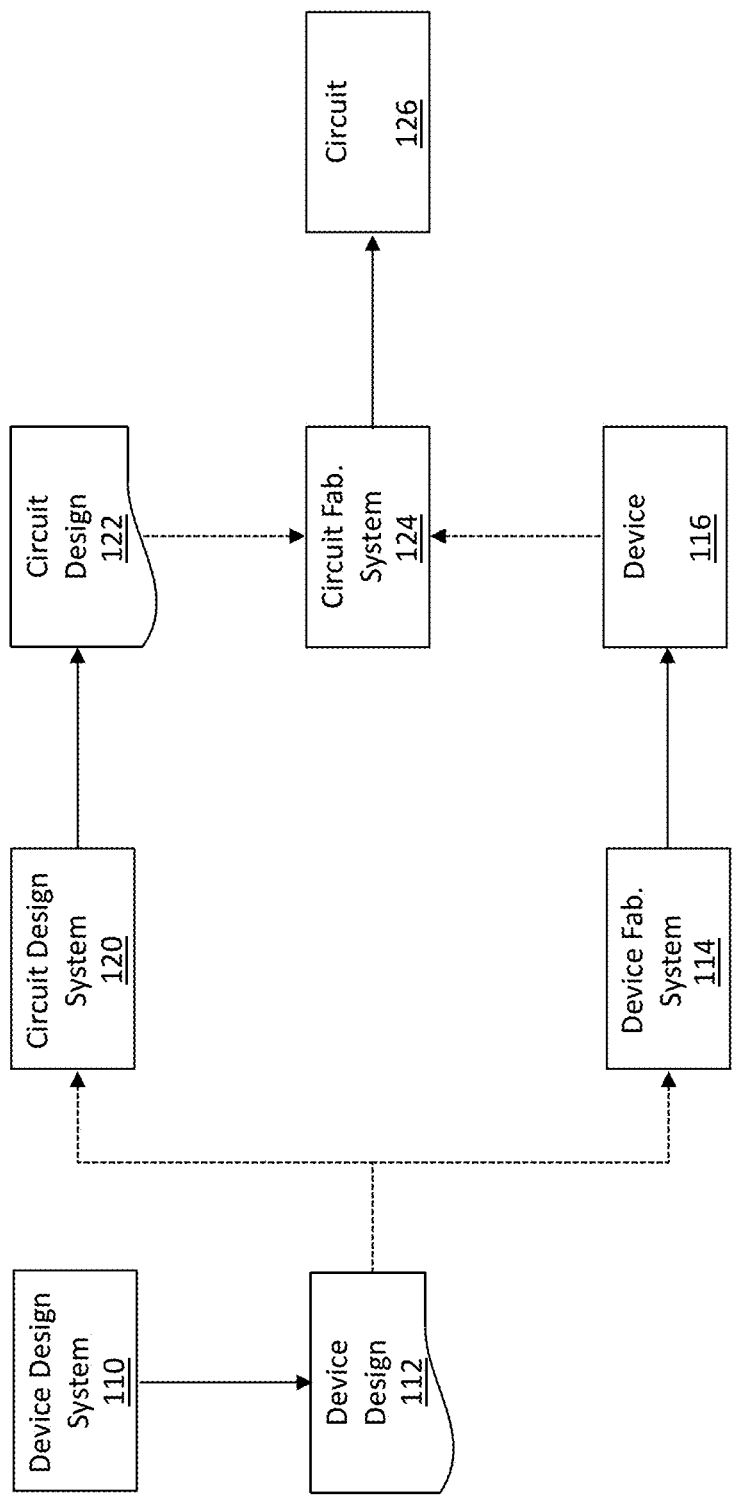
FIG. 14 shows an illustrative flow diagram for fabricating a circuit according to an embodiment.

To this extent, FIG. 14 shows an illustrative flow diagram for fabricating a circuit 126 according to an embodiment. Initially, a user can utilize a device design system 110 to generate a device design 112 using a method described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed using a method described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed using a method described herein.

In another embodiment, the invention provides a device design system 110 for designing and/or a device fabrication system 114 for fabricating a semiconductor device 116 by using a method described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated using a method described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
  a group III nitride radiation generating structure; and
  a group III nitride superlattice layer at least partially transparent to radiation generated by the radiation generating structure, wherein the superlattice layer comprises a set of quantum well and barriers, wherein a valence band discontinuity between a quantum well and an immediately adjacent barrier in the superlattice layer is such that a dopant energy level of a dopant in the immediately adjacent barrier in the superlattice layer is within three thermal energies of at least one of: a valence energy band edge for the quantum well or a ground state energy for free carriers in a valence energy band for the quantum well.

2. The device of claim 1, wherein the superlattice layer transmits at least five percent of radiation that is generated by the radiation generating structure and enters the superlattice layer.

3. The device of claim 1, wherein the radiation is ultraviolet radiation.

4. The device of claim 3, wherein the ultraviolet radiation is deep ultraviolet radiation.

5. The device of claim 1, wherein a thickness of each quantum well and barrier in the superlattice layer is in a range between a single monolayer and the Bohr radius constant.

6. The device of claim 1, wherein the group III nitride material of a barrier of the superlattice layer varies along lateral dimensions of the barrier such that a lateral cross section of the barrier includes:
   a set of transparent regions, each transparent region having a transmission coefficient for the target wavelength greater than or equal to approximately sixty percent, wherein the set of transparent regions are at least ten percent of an area of the lateral cross section of the barrier; and
   a set of higher conductive regions occupying a sufficient area of the area of the lateral cross section of the barrier and having an average resistance per unit area to a vertical current flow resulting in a total voltage drop across the semiconductor structure of less than ten percent of a total voltage drop across the structure.

7. The device of claim 1, further comprising a p-type contact layer, wherein the superlattice layer is located between the radiation generating structure and the p-type contact layer.

8. The device of claim 7, further comprising an electron blocking layer located between the radiation generating structure and the superlattice layer.

9. The device of claim 1, wherein at least one of: the quantum wells or the barriers, have group III nitride compositions that change across the superlattice layer.

10. The device of claim 1, wherein an acceptor energy level in at least one barrier of the superlattice layer varies relative to a valence energy band edge for the at least one barrier.

11. The device of claim 1, wherein a quantum well of the superlattice layer is modulation doped.

12. The device of claim 1, wherein at least one of: a composition or a width, of a plurality of periods of the superlattice layer changes from a first side of the superlattice layer to a second side of the superlattice layer opposite the first side, wherein each of the plurality of periods includes a single quantum well and a single immediately adjacent barrier.

13. The device of claim 12, wherein the change is configured to transition from a first type of material of a layer immediately adjacent to the first side to a second type of material of a layer immediately adjacent to the second side.

14. An ultraviolet device comprising:
   a group III nitride n-type layer;
   a group III nitride ultraviolet radiation generating structure located on the group III nitride n-type layer; and
   a group III nitride superlattice layer at least partially transparent to ultraviolet radiation generated by the radiation generating structure located on the ultraviolet radiation generating structure, wherein the superlattice layer comprises a set of quantum well and barriers, wherein a valence band discontinuity between a quantum well and an immediately adjacent barrier in the superlattice layer is such that a dopant energy level of a dopant in the immediately adjacent barrier in the superlattice layer is within three thermal energies of at least one of: a valence energy band edge for the quantum well or a ground state energy for free carriers in a valence energy band for the quantum well.

15. The device of claim 14, wherein the group III nitride material of a barrier of the superlattice layer varies along lateral dimensions of the barrier such that a lateral cross section of the barrier includes:
   a set of transparent regions, each transparent region having a transmission coefficient for the target wavelength greater than or equal to approximately sixty percent, wherein the set of transparent regions are at least ten percent of an area of the lateral cross section of the barrier; and
   a set of higher conductive regions occupying a sufficient area of the area of the lateral cross section of the barrier and having an average resistance per unit area to a vertical current flow resulting in a total voltage drop across the semiconductor structure of less than ten percent of a total voltage drop across the structure.

16. The device of claim 14, wherein at least one of: a composition or a width, of a plurality of periods of the superlattice layer changes from a first side of the superlattice layer to a second side of the superlattice layer opposite the first side, wherein each of the plurality of periods includes a single quantum well and a single immediately adjacent barrier.

17. The device of claim 14, further comprising a p-type contact layer, wherein the superlattice layer is located between the radiation generating structure and the p-type contact layer.

18. An ultraviolet device comprising:
   a n-type layer;
   a radiation generating structure located on the n-type layer, wherein the ultraviolet radiation generating structure comprises a multiple quantum well structure; and
   a superlattice layer at least partially transparent to ultraviolet radiation generated by the radiation generating structure located on the ultraviolet radiation generating structure, wherein the superlattice layer comprises a set of quantum well and barriers, wherein a valence band discontinuity between a quantum well and an immediately adjacent barrier in the superlattice layer is such that a dopant energy level of a dopant in the immediately adjacent barrier in the superlattice layer is within three thermal energies of at least one of: a valence energy band edge for the quantum well or a ground state energy for free carriers in a valence energy band for the quantum well.

19. The device of claim 18, further comprising:
   an electron blocking layer located between the radiation generating structure and the superlattice layer; and
   a p-type contact layer, wherein the superlattice layer is located between the electron blocking layer and the p-type contact layer.

20. The device of claim 18, wherein a thickness of each barrier and quantum well in the superlattice layer enables resonant tunneling of holes during operation of the device.

* * * * *